US012808963B2

(12) United States Patent
Wang et al.

(10) Patent No.: US 12,808,963 B2
(45) Date of Patent: Nov. 24, 2026

(54) REDUCED MAGNETIC FLUX LEAKAGE AND INCREASED MAGNETIC FIELD UNIFORMITY IN MAGNETIC RESONANCE IMAGING (MRI) DEVICES

(71) Applicant: Zepp Europe Holding B.V., Amsterdam-Duivendrecht (NL)

(72) Inventors: Haoyang Wang, Hefei (CN); Kongqiao Wang, Cupertino, CA (US)

(73) Assignee: Zepp Europe Holding B.V., Amsterdam-Duivendrecht (NL)

( * ) Notice: Subject to any disclaimer, the term of this patent is extended or adjusted under 35 U.S.C. 154(b) by 205 days.

(21) Appl. No.: 18/886,126

(22) Filed: Sep. 16, 2024

(65) Prior Publication Data

US 2026/0079222 A1 Mar. 19, 2026

(51) Int. Cl.
*G01R 33/44* (2006.01)
*G01R 33/3873* (2006.01)

(52) U.S. Cl.
CPC ........ *G01R 33/445* (2013.01); *G01R 33/3873* (2013.01)

(58) Field of Classification Search
CPC ........ G01R 33/00; G01R 33/20; G01R 33/28; G01R 33/383802; G01R 33/383; G01R 33/387; G01R 33/3873; G01R 33/42; G01R 33/421; G01R 33/44; G01R 33/445
USPC .................................................. 324/300, 307
See application file for complete search history.

(56) References Cited

U.S. PATENT DOCUMENTS 5,237,275 A * 8/1993 Takechi ............. G01R 33/3873 324/319
6,333,630 B1 12/2001 Holsinger et al.
7,034,537 B2 * 4/2006 Tsuda ................... G01R 33/389 324/307

FOREIGN PATENT DOCUMENTS

CN 102360691 A 2/2012
WO WO-2006097864 A1 * 9/2006 ......... G01R 33/3875

* cited by examiner

*Primary Examiner* — Hoai-An D. Nguyen
(74) *Attorney, Agent, or Firm* — Young Basile Hanlon & MacFarlane, P.C.

(57) ABSTRACT

A magnetic resonance imaging (MRI) device is disclosed that includes: a frame assembly; a magnet assembly that is supported by the frame assembly and which is configured to generate a primary magnetic field; and shim magnets that are configured to generate an ancillary magnetic field, which supplements the primary magnetic field. The shim magnets are adjustably supported by the frame assembly such that the shim magnets are repositionable in relation thereto in order to increase uniformity of the primary magnetic field.

21 Claims, 11 Drawing Sheets

REDUCED MAGNETIC FLUX LEAKAGE AND INCREASED MAGNETIC FIELD UNIFORMITY IN MAGNETIC RESONANCE IMAGING (MRI) DEVICES

TECHNICAL FIELD

The present disclosure relates generally to magnetic resonance imaging (MRI) devices and, more specifically, to low-field MRI devices that offer reduced magnetic flux leakage and increased magnetic field uniformity.

BACKGROUND

Low-field MRI devices (i.e., those with a magnetic field strength less than approximately 1 T) are attracting increased attention in that they are lightweight and mobile. To reduce weight and increase mobility, the frames in low-field MRI devices typically include light, non-magnetic materials to replace the iron yoke. However, the use of non-magnetic frames can create performance and reliability issues including, for example, magnetic flux leakage and electromagnetic interference.

As a countermeasure, known low-field MRI devices often include magnetic shims (e.g., plates, patches, etc.) that are adhesively connected (secured) to (or adjacent to) the magnetic poles. However, in addition to being unreliable, shimming offers limited improvements in magnetic field uniformity and can create potential contamination issues resulting from adhesive residue (e.g., in the event that one or more of the shims has to be removed and/or re-set). Additionally, known shimming procedures are performed manually, which increases the overall costs associated with the MRI device (e.g., manufacturing and/or maintenance costs) and inhibits mass production.

The present disclosure addresses these issues by providing a lightweight, low-field MRI device that includes inner and outer shields, which reduce magnetic flux leakage and inhibit external electromagnetic interference with the MRI device, as well as adjustable shim magnets, which are repositionable in order to increase the uniformity in the magnetic field.

SUMMARY

In one aspect of the present disclosure, an MRI device is disclosed that includes: a frame assembly; a magnet assembly that is supported by the frame assembly and which is configured to generate a primary magnetic field; and shim magnets that are configured to generate an ancillary magnetic field, which supplements the primary magnetic field. The shim magnets are adjustably supported by the frame assembly such that the shim magnets are repositionable in relation thereto in order to increase uniformity of the primary magnetic field.

In certain embodiments, the magnet assembly may include a plurality of magnetic blocks.

In certain embodiments, the shim magnets may be positioned between the plurality of magnetic blocks.

In certain embodiments, the shim magnets may be rotatably adjustable.

In certain embodiments, the shim magnets may threadably engage the frame assembly such that rotation of the shim magnets causes axial displacement thereof.

In certain embodiments, the MRI device may further include actuators that are connected to the shim magnets to facilitate repositioning thereof.

In another aspect of the present disclosure, an MRI device is disclosed that includes: a frame assembly, which defines a scanning area and includes an outer frame and an inner frame that is supported by the outer frame; a magnet assembly that is supported by the inner frame and which is configured to generate a magnetic field; an inner shield that is supported by the outer frame and the inner frame; and an outer shield that extends about the outer frame. The inner shield collects and distributes magnetic flux from the magnet assembly about the scanning area to thereby reduce magnetic flux leakage, and the outer shield further reduces magnetic flux leakage and inhibits external electromagnetic interference with the MRI device.

In certain embodiments, the inner shield may include magnetic tiles that are configured as discrete components thereof.

In certain embodiments, the magnetic tiles may be spaced from each other so as to reduce eddy current.

In certain embodiments, the magnetic tiles may include first magnetic tiles that are arranged in a first orientation, and second magnetic tiles that are arranged in a second orientation, which is different from the first orientation.

In certain embodiments, the first magnetic tiles and the second magnetic tiles may be oriented in generally orthogonal relation.

In another aspect of the present disclosure, an MRI device is disclosed that includes: a frame assembly, which defines a scanning area and includes an outer frame and an inner frame that is supported by the outer frame, wherein the inner frame includes an upper tray and a lower tray that is spaced from the upper tray along a longitudinal axis of the MRI device; an upper magnet assembly that is positioned within the upper tray; a lower magnet assembly that is positioned within the lower tray, wherein the upper magnet assembly and the lower magnet assembly collectively generate a primary magnetic field; an inner shield that is supported by the outer frame and the inner frame; an outer shield that extends about the outer frame; and shim magnets that are configured to generate an ancillary magnetic field which supplements the primary magnetic field. The inner shield collects and distributes magnetic flux from the upper magnet assembly and the lower magnet assembly about the scanning area to thereby reduce magnetic flux leakage and contain the primary magnetic field withing a generally closed magnetic circuit in order to reduce a 5 Gauss line of the MRI device, and the outer shield further reduces magnetic flux leakage and inhibits external electromagnetic interference with the MRI device. The shim magnets are adjustably supported by the inner frame such that the shim magnets are repositionable in relation thereto in order to increase uniformity of the primary magnetic field. The shim magnets include upper shim magnets, which are positioned between magnetic blocks of the upper magnet assembly, and lower shim magnets, which are positioned between magnetic blocks of the lower magnet assembly.

In certain embodiments, the inner shield may include magnetic tiles that are configured as discrete components thereof.

In certain embodiments, the magnetic tiles may be spaced from each other so as to reduce eddy current.

In certain embodiments, the magnetic tiles may include first magnetic tiles that are arranged in a first orientation, and second magnetic tiles that are arranged in a second orientation, which is different from the first orientation.

In certain embodiments, the first magnetic tiles and the second magnetic tiles may be oriented in generally orthogonal relation.

In certain embodiments, the first magnetic tiles may be arranged in a generally axial orientation such that the first magnetic tiles extend in generally parallel relation to the longitudinal axis of the MRI device, and the second magnetic tiles may be arranged in a generally lateral orientation.

In certain embodiments, the shim magnets may be rotatably adjustable.

In certain embodiments, the shim magnets and the inner frame may include corresponding threaded surfaces, whereby the shim magnets threadably engage the inner frame such that rotation of the shim magnets causes axial displacement thereof.

In certain embodiments, the shim magnets may each include a core, which includes a magnetic material, and a bushing, which receives the core and includes a non-magnetic material.

In certain embodiments, the core may include an interface that is configured for engagement with a tool to facilitate manual adjustment of shim magnets.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

The present disclosure describes a low-field MRI device that includes: a lightweight, non-metallic frame assembly; a magnet assembly that generates a primary magnetic field; gradient panels that generate a secondary magnetic field; at least one of outer and inner shields that reduce magnetic flux leakage and inhibit (e.g., prevent) external electromagnetic interference with the MRI device; and shim magnets that generate an ancillary magnetic field, which supplements the primary magnetic field. The shim magnets are adjustable (i.e., movable, repositionable) in order to vary the distribution of the ancillary magnetic field and thereby increase the uniformity of the primary magnetic field. The shim magnets are movably coupled to the frame assembly, and the positions of the shim magnets are adjustable relative to the frame assembly. In some implementations, the frame assembly and the shim magnets include corresponding threaded surfaces, which allow for incremental variations in the axial (e.g., vertical) positions of the shim magnets upon rotation thereof. In some implementations, the frame assembly and the shim magnets include adapted surfaces, which allow for variations in the radial (e.g., horizontal) positions of the shim magnets.

Figure 1:
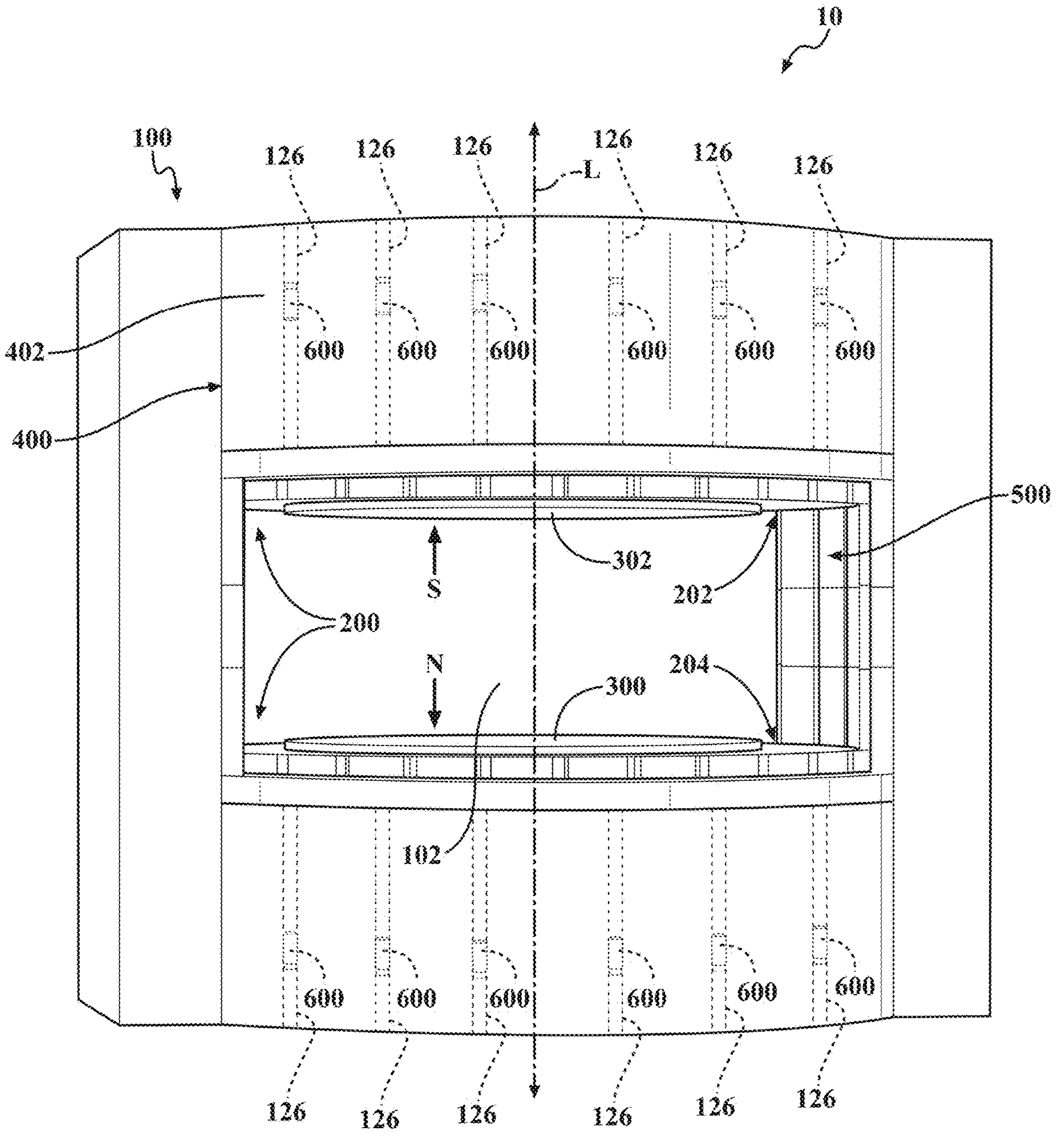
FIG. 1 is a front, perspective view of an MRI device according to the principles of the present disclosure, which includes: a frame assembly having an outer frame and an inner frame; a magnet assembly; gradient panels; an outer shield; an inner shield; and (adjustable) shim magnets.

With reference to the drawings, as shown in FIG. 1, an MRI device 10 includes: a frame assembly 100; a magnet assembly 200; (first, upper and second, lower) gradient panels 300, 302; an outer shield 400; an inner shield 500; and shim magnets 600. In various embodiments of the disclosure, it is envisioned that one or more of the above-mentioned elements may be omitted. For example, it is envisioned that the inner shield 500 or the outer shield 400 may be omitted from the MRI device 10. Furthermore, although two gradient panels 300, 302 are illustrated in FIG. 1, embodiments are envisioned in which the particular number of gradient panels 300, 302 may be increased or decreased, as are embodiments in which the gradient panels may be configured in an alternate configuration (form). Additionally, embodiments are envisioned in which at least one of the outer shield 400 and/or the inner shield 500 may include an alternate configuration. In addition, although generally illustrated and described in the context of MRI herein below, it is envisioned that the principles of the present disclosure may find applicability to magnetic resonance spectroscopy (MRS) as well.

The frame assembly 100 supports the magnet assembly 200, the respective outer and inner shields 400, 500, and the shim magnets 600, and defines a scanning area 102 that is configured to receive a patient during an imaging procedure. The frame assembly 100 is non-metallic in construction. More specifically, in the illustrated embodiment, the frame assembly 100 is formed partially or entirely from carbon fiber, which is light and solid. The carbon fiber construction of the frame assembly 100 thus not only reduces the weight of the MRI device 10, thereby improving portability, but facilitates batch and automated production of the MRI device 10 as well as subsequent quality inspection.

Figure 2:
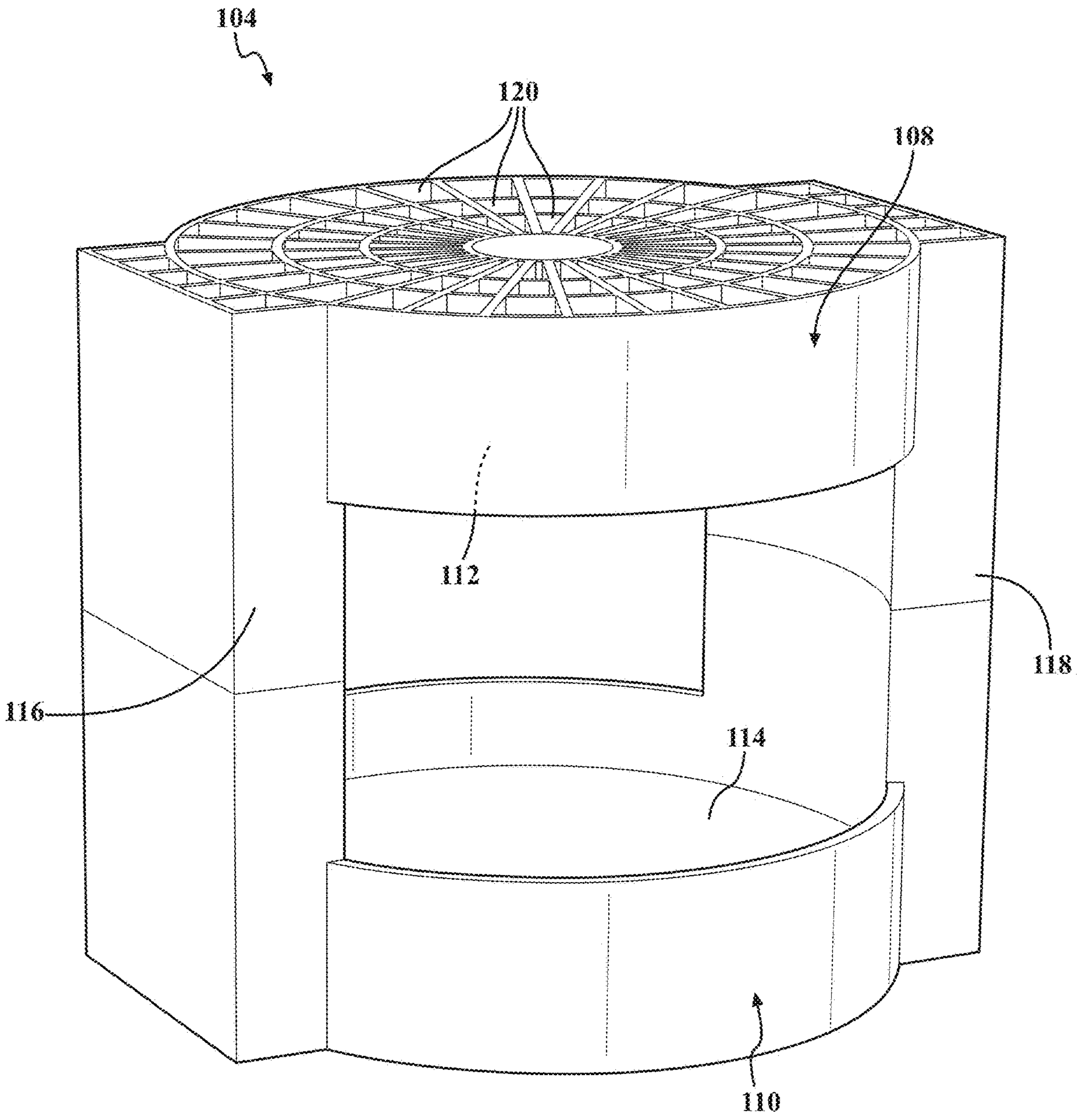
FIG. 2 is a top, perspective view of the outer frame.
Figure 3:
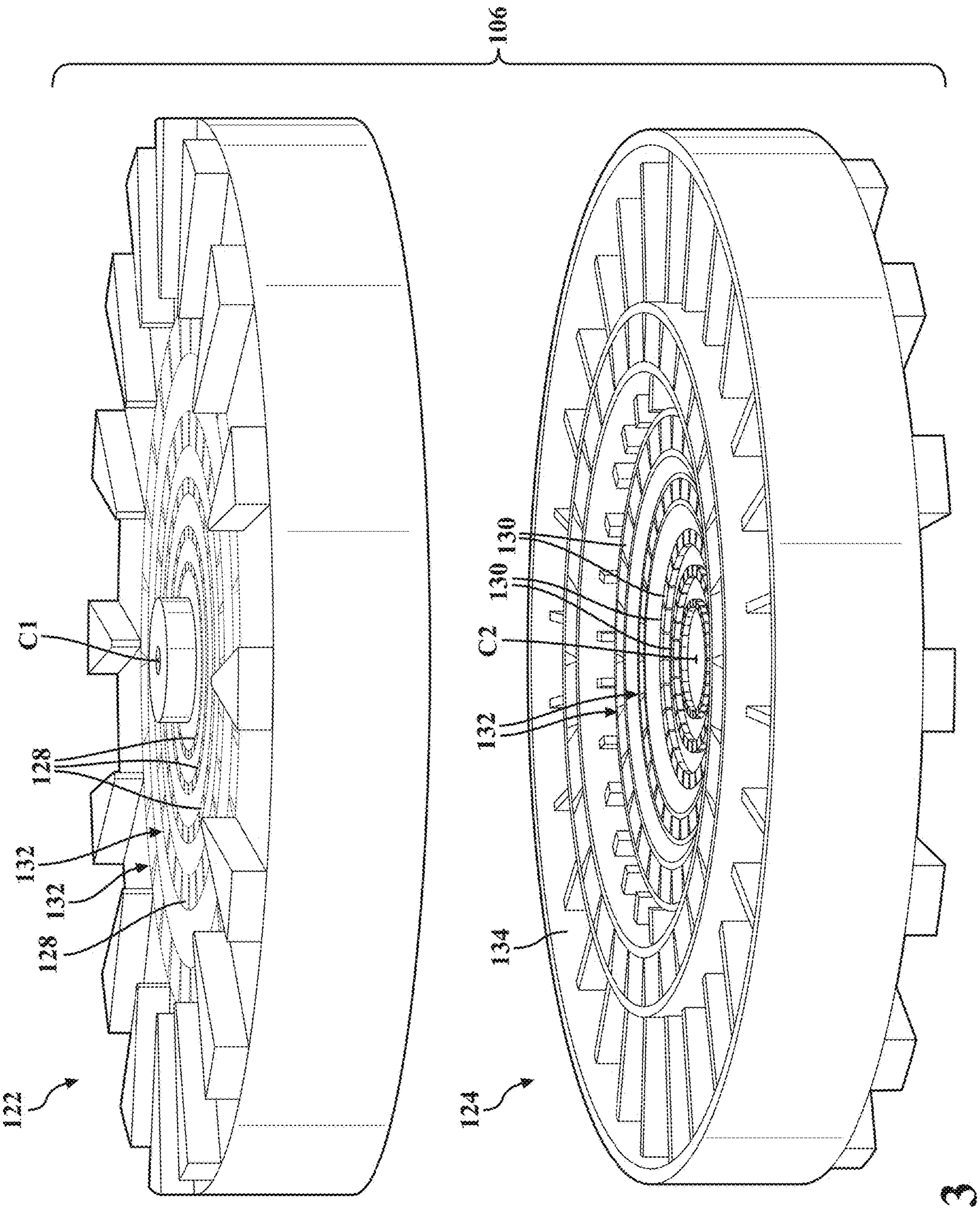
FIG. 3 is a top, perspective view of the inner frame.

The frame assembly 100 may include one or more frame members. In some implementations, the frame assembly 100 includes an outer frame 104 as shown in FIG. 2 and an inner frame 106 as shown in FIG. 3. The outer frame 104 is the main load-bearing structure of the MRI device 10 and supports the inner frame 106 and at least a part of the inner shield 500, as described in further detail below. The inner frame 106 may be fixedly attached to the outer frame 104, or detachably attached to the outer frame 104. In some alternate implementations, the inner frame 106 may be integral with the outer frame 104.

In the illustrated embodiment, the outer frame 104 includes a (first, upper) support member 108 defining (first, upper) chamber 112, a (second, lower) support member 110 defining (second, lower) chamber 114, and backspans 116, 118, which extend axially (e.g., vertically) between the support members 108 and 110. It is envisioned, however, that the particular configuration of the outer frame 104 may be varied in alternate embodiments without departing from the scope of the present disclosure. For example, the outer frame 104 may include a single backspan such that the outer frame 104 is generally C-shaped configuration. For another example, the outer frame 104 may include more backspans, or include no backspan at all. In some alternate implementations, the outer frame 104 may include more or less support members, or the outer frame 104 may be arranged in other configurations.

In the illustrated embodiment, at least one of the support members 108, 110 further includes (or defines) cavities 120. The cavities 120 enlarge the scanning area 102 without adding significant weight to the outer frame 104 and provide access to the shim magnets 600 (FIGS. 1, 8, 10), which are described in further detail below (e.g., to improve serviceability of the MRI device 10).

In some implementations, at least one of the openings 126 may extend through the cavities 120. In some alternate implementations, at least one of the openings 126 may extend through partition members of the cavities, which is not limited herein.

Referring to FIG. 3, the inner frame 106 is supported by the outer frame 104 and includes a (first, upper) tray 122, which is positioned within or received by the chamber 112, and a (second, lower) tray 124, which is located within or received by the chamber 114. The tray 124 is spaced from the tray 122 along a longitudinal axis L of the MRI device 10 shown in FIG. 1.

The MRI device 10 includes openings 126 (FIGS. 1, 8, 10), which extend through at least one of the outer shield 400, the outer frame 104, the inner frame 106 (i.e., the trays 122, 124), or the inner shield 500, and are configured to receive the shim magnets 600, as described in further detail below. The openings 126 thus provide access to the shim magnets 600 in order to facilitate adjustment thereof, which is discussed in further detail below, without requiring disassembly of the MRI device 10.

The inner frame 106 may include one or more receptacles for supporting or receiving at least a part of the magnet assembly. In the example shown in FIG. 3, the tray 122 may define a plurality of receptacles (or chambers) 128, which are arranged in concentric rings 132 so as to define transverse cross-sectional dimensions (e.g., diameters) that increase with distance from the centerpoint C1 of the tray 122. In some implementations, the second tray 124 may define a plurality of second receptacles (or chambers) 130, which are arranged in concentric rings 132 so as to define transverse cross-sectional dimensions (e.g., diameters) that increase with distance from the centerpoint C2 of the second tray 124.

Although shown as increasing in size with distance from the centerpoints C1, C2, in alternate embodiments, at least one of the receptacles 128 or 130 may decrease in size with distance from the corresponding centerpoints C1 and C2, or may have a same size with distance from the corresponding centerpoints C1 and C2, or may be arranged with a random size with distance from the corresponding centerpoints C1 and C2, or the like. The sizes of the receptacles may include a dimension in the lateral or radial direction, or a dimension in the axial or vertical dimension, or both.

While the trays 122, 124 and the concentric rings 132 are illustrated as being generally annular (e.g., circular) in configuration, it is envisioned that the particular configurations of at least one of the trays 122, 124 and/or the concentric rings 132 may be varied. For example, at least one of the receptacles 128 or 130 may be arranged in configurations rather than the concentric rings, such as a grid or other patterns. For example, the trays 122, 124 and/or the concentric rings 132 may be generally elliptical in configuration, or the trays 122, 124 and/or the concentric rings 132 may be generally polygonal (e.g., generally square or generally rectangular) in configuration, or the like.

The receptacles 128 and 130 may be configured to support or receive at least a part of the magnet assembly 200. In the illustrated embodiment, at least one of the trays 122, 124 may further include or define cavities (or reliefs) 134. The cavities 134 may be separated by reinforcement bars. The cavities 134 enlarge the trays 122, 124 and, thus, the scanning area 102, to facilitate the accommodation of a patient while reducing the amount of material that is required for construction of the inner frame 106, which reduces the cost and the weight of the inner frame 106 without compromising the structural integrity and strength thereof. In the illustrated embodiment, the cavities 134 are positioned laterally (e.g., radially) outward of the receptacles 128, 130 and the magnet assembly 200, such that the magnet assembly 200 is located in central areas of the trays 122, 124. It is envisioned, however, that the cavities 134 may be included in any suitable position (location).

Figure 4:
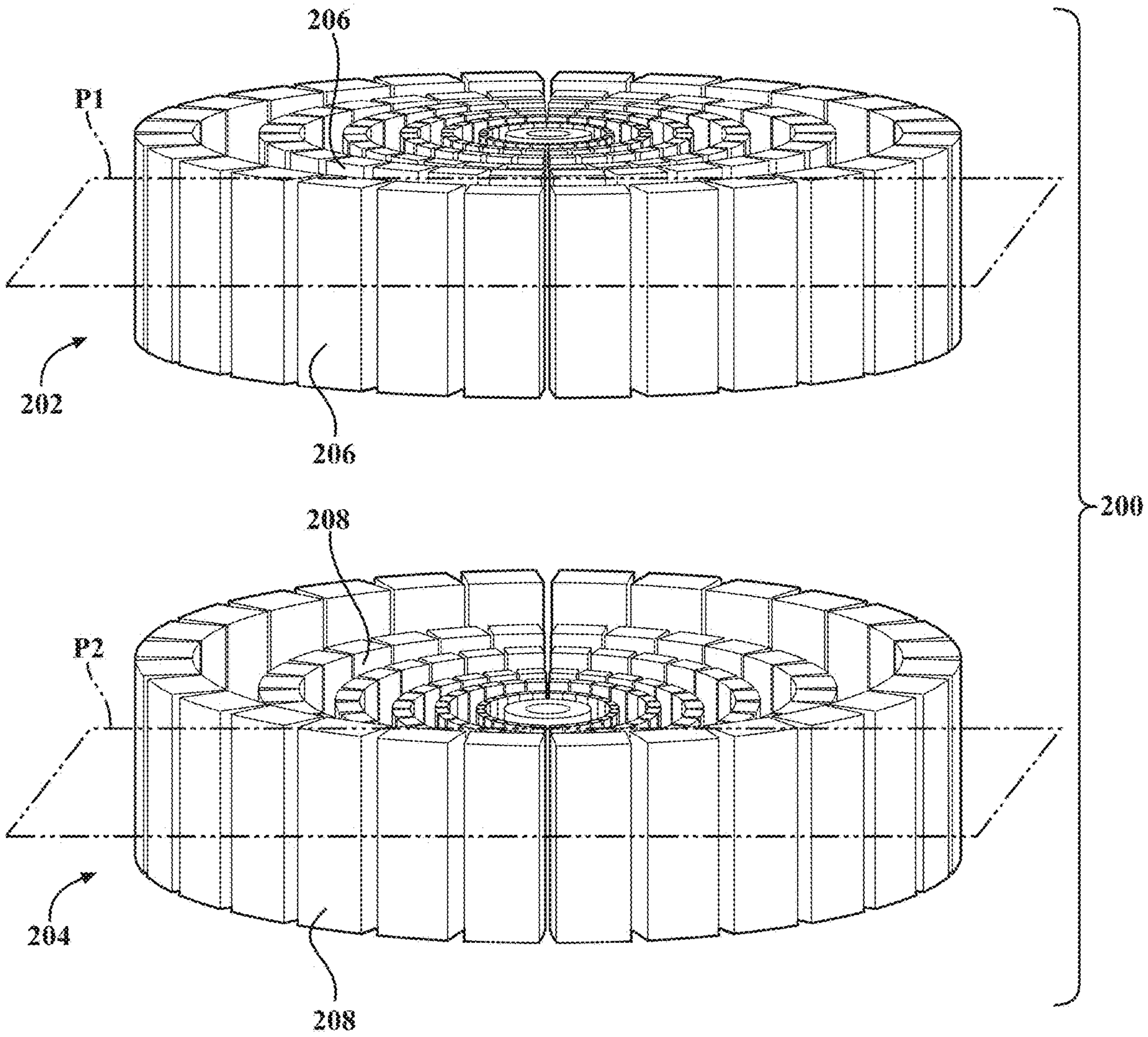
FIG. 4 is a top, perspective view of the magnet assembly.

The magnet assembly 200 may include a plurality of magnetic blocks with same or varied sizes, and the configuration of the magnetic blocks may be adapted to that of the receptacles. Referring to FIG. 4, the magnet assembly 200 is supported by (i.e., connected to or secured by) the frame assembly 100 (i.e., the inner frame 106) and is configured to generate a primary or main magnetic field across the scanning area 102 shown in FIG. 1. In the illustrated embodiment, the MRI device 10 is configured to generate a primary magnetic field with a strength lower than 150 mT, such as approximately 80 mT or the like. Embodiments of the MRI device 10 in which the strength of the primary magnetic field may be increased or decreased are also envisioned herein (e.g., depending upon the intended use of the MRI device 10), however, and would not be beyond the scope of the present disclosure.

In some implementations, the magnet assembly 200 includes a plurality of magnet assemblies. In the example shown in FIG. 4, the magnet assembly 200 includes upper (first) magnet assembly 202 and lower (second) magnet assembly 204, which are oriented in facing relation and which define opposite (e.g., South and North) magnetic poles S, N (FIGS. 1, 7) of the MRI device 10, respectively.

The upper magnet assembly 202 is positioned within the tray 122 and includes (first, upper) (permanent) magnetic blocks 206, and the lower magnet assembly 200 is positioned within the tray 124 and includes (second, lower) (permanent) magnetic blocks 208, wherein the magnetic blocks 206 and 208 collectively generate the primary magnetic field for the MRI device 10. In some implementations, the magnetic blocks 206 are received within the receptacles 128 defined by the tray 122, such that magnetic blocks 206 are arranged into the aforementioned concentric rings 132 along a single plane P1 shown in FIG. 4 (i.e., such that the plane P1 extends through each of the magnetic blocks 206). Similarly, the magnetic blocks 208 may be received within the receptacles 130 defined by the tray 124, such that the magnetic blocks 208 are arranged into the aforementioned concentric rings 132 along a single plane P2 shown in FIG. 4 (i.e., such that the plane P2 extends through each of the magnetic blocks 208). In some implementations, at least one of the magnetic blocks 206 and 208 may be arranged in uniform and symmetrical distributions. In some other implementations, the magnetic blocks 206 and/or the magnetic blocks 208 may be stacked along the axial direction L of the MRI device 10 or arranged in other configurations in the receptacles.

Figure 10:
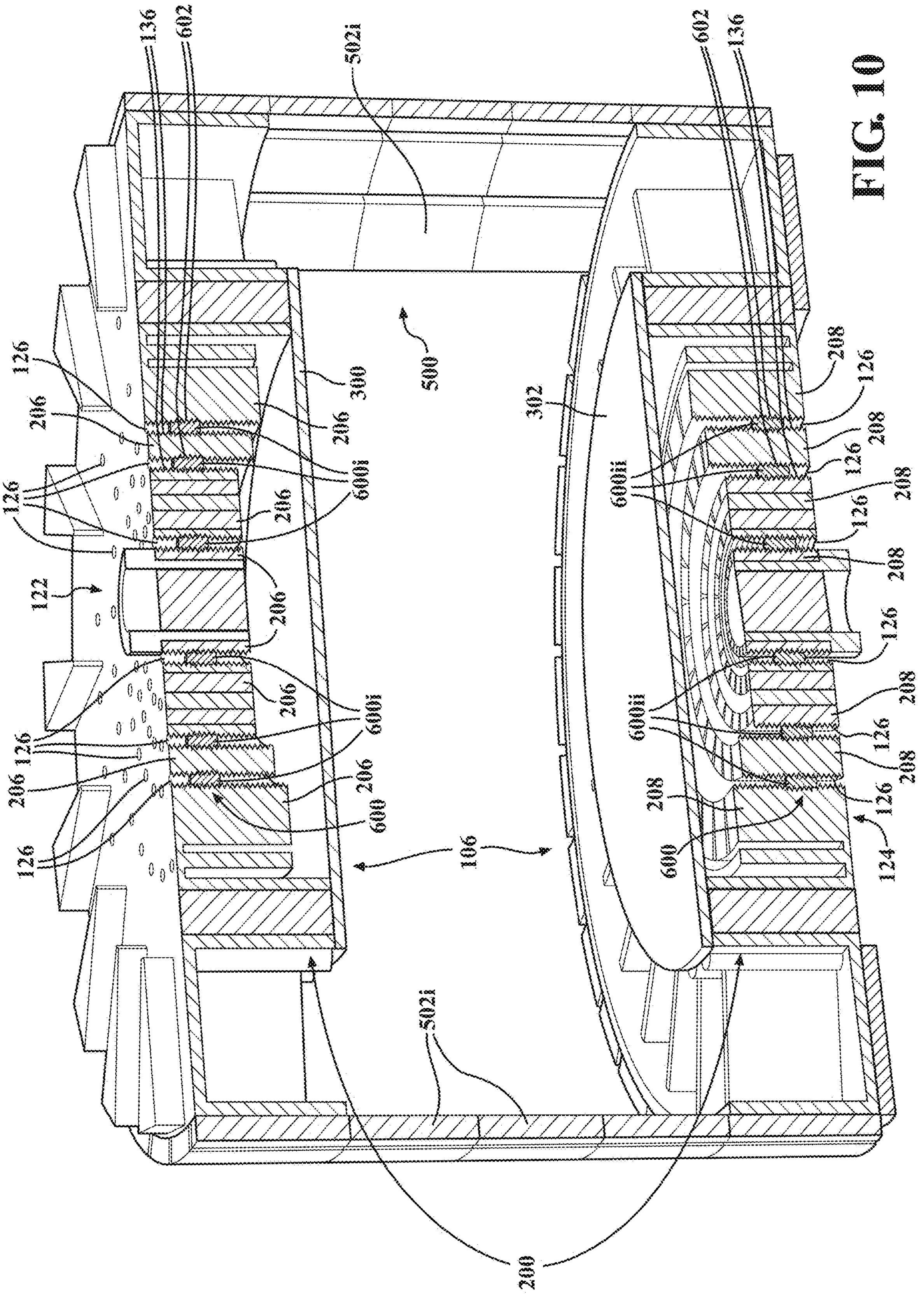
FIG. 10 is a partial, cross-sectional view of the MRI device illustrating the inner frame, the magnet assembly, the gradient panels, the inner shield, and the shim magnets.

Referring to FIG. 1 and FIG. 10, the gradient panels 300, 302 are supported by (i.e., connected or secured to) the inner frame 106 (i.e., the respective trays 122, 124) and are configured to generate a secondary magnetic field upon receiving an electrical current. The secondary magnetic field generated by the gradient panels 300, 302 distorts the primary magnetic field generated by the magnet assembly 200 in a predictable pattern, which facilitates spatial encoding of the MRI signals and supports a range of physiologic techniques. The gradient panels 300, 302 thus facilitate the creation of anatomical reconstructions with accurate spatial relationships and may include any components suitable for that intended purpose such as, for example, at least one RF coil or the like. In the illustrated embodiment, the gradient panels 300 and 302 are arranged between the tray 122 and the tray 124. In some implementations, the gradient panel 300 may be near to the tray 122, and may be arranged facing the tray 122. Similarly, the gradient panel 302 may be near to the tray 124, and may be arranged facing the tray 124.

In some implementations, the MRI device 10 may further include the outer shield 400. As shown in FIG. 1, the outer shield 400 is supported by (i.e., connected or secured to) and extends about the frame assembly 100 (i.e., the outer frame 104). In some examples, the outer shield 400 includes a metallic skin 402 and acts as a barrier that not only reduces magnetic flux leakage and, thus, the 5 Gauss line of the MRI device 10, but inhibits (e.g., prevents) external electromagnetic interference with the MRI device 10. More specifically, the outer shield 400 includes a high saturation magnetic flux density material or a high saturation soft magnetic material (e.g., a soft magnetic alloy with a high saturation magnetization). For example, in one particular embodiment, it is envisioned that the outer shield 400 may include a silicon steel plate, and the silicon steel plate may have a thickness that lies substantially within the range of approximately 1 mm to approximately 1.5 mm.

In certain embodiments, it is envisioned that the outer shield 400 may be electroplated (e.g., using copper) and passivated in order to increase the efficacy thereof vis-à-vis reducing magnetic flux leakage and inhibiting (e.g., preventing) external electromagnetic interference with the MRI device 10.

In some implementations, the MRI device may further include the inner shield 500. The inner shield 500 (FIGS. 1, 5, 6, 8-10) is supported by the frame assembly 100. More specifically, the inner shield 500 is supported by (i.e., connected or secured to) both the outer frame 104 and the inner frame 106 and is positioned therebetween, as described in further detail below.

The inner shield 500 is configured to collect and distribute magnetic flux from the magnet assembly 200 (FIG. 4) (i.e., the respective upper and lower magnet assemblies 202, 204) about the scanning area 102 (FIG. 1) to further reduce magnetic flux leakage and contain the primary magnetic field within a generally closed magnetic circuit (flux loop) M (FIG. 7) in order to increase the strength thereof and further reduce the 5 Gauss line of the MRI device 10 along one or more axes X, Y, Z (FIG. 9) during operation. For example, it is envisioned that the combined magnetic shielding provided by the respective outer and inner shields 400, 500 may reduce the 5 Gauss line of the MRI device from approximately 1.85 m, approximately 1.85 m, and approximately 2 m to approximately 1.1 m, approximately 1.0 m, and approximately 1.22 m along the X, Y, and Z axes (i.e., by approximately 40%, approximately 45%, and approximately 40%), respectively.

It is envisioned that the combined magnetic shielding provided by the respective outer and inner shields 400, 500 and the resulting reduction in magnetic flux leakage may facilitate the use of less magnetic material (e.g., fewer and/or smaller magnetic blocks 206, 208 (FIG. 4)) for a given intensity of the primary magnetic field, thereby further reducing the weight of the MRI device 10 and further improving portability. More specifically, it is envisioned that the respective outer and inner shields 400, 500 may increase the intensity of the primary magnetic field by approximately 30% to approximately 50% for a given quantity of magnetic material in the magnet assembly 200.

In one specific example, in an embodiment of the MRI device 10 that is devoid of the respective outer and inner shields 400, 500, it is envisioned that the MRI device 10 may weigh approximately 250 Kg and generate a primary magnetic field with a strength of approximately 75 mT. Upon incorporation of the respective outer and inner shields 400, 500, however, the weight of the MRI device 10 is increased to approximately 380 Kg, and the strength of the primary magnetic field is increased to approximately 100 mT (or more). By reducing the amount of magnetic material from the magnet assembly 200 and/or the inner shield 500, the weight of the MRI device 10 can be reduced to approximately 280 Kg while maintaining a primary magnetic field with a strength of approximately 80 mT.

Figure 5:
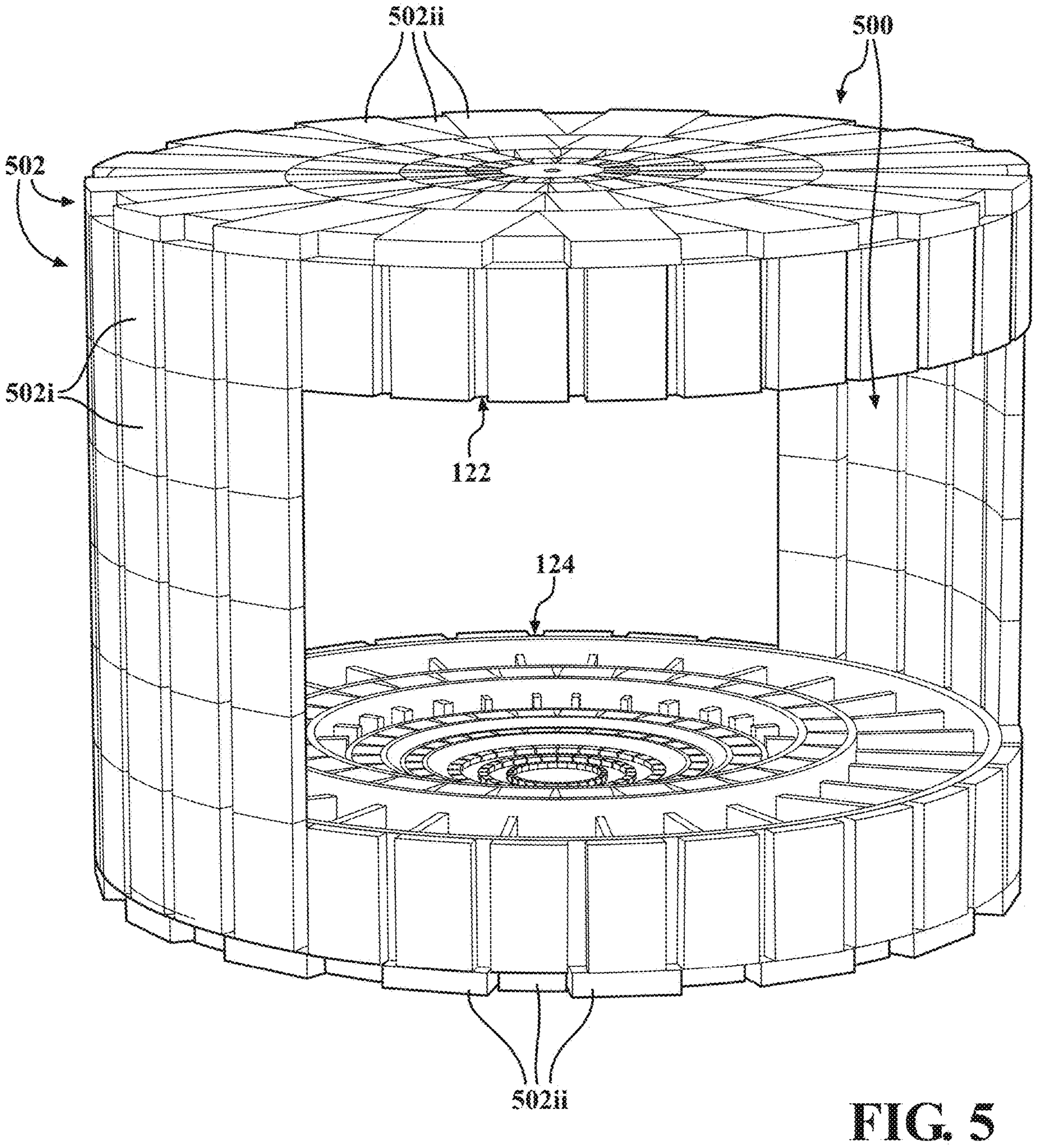
FIG. 5 is a partial, top, perspective view of the MRI device illustrating the inner frame and the inner shield.

In some implementations, as shown in FIG. 5, the inner shield 500 includes magnetic tiles 502, which are configured as discrete components of the inner shield 500 that are spaced apart from each other to reduce eddy current and provide access to the shim magnets 600. The magnetic tiles 502 are supported by (i.e., connected or secured to) at least one of the inner frame 106 (i.e., the trays 122, 124) and the outer frame 104 (e.g., the backspans 116, 118), such that the magnetic tiles 502 are located laterally (e.g., radially) between the trays 122 and 124, and/or between the support members 108 and 110, and/or are located axially (e.g., vertically) between the trays 122 and 124.

Figure 7:
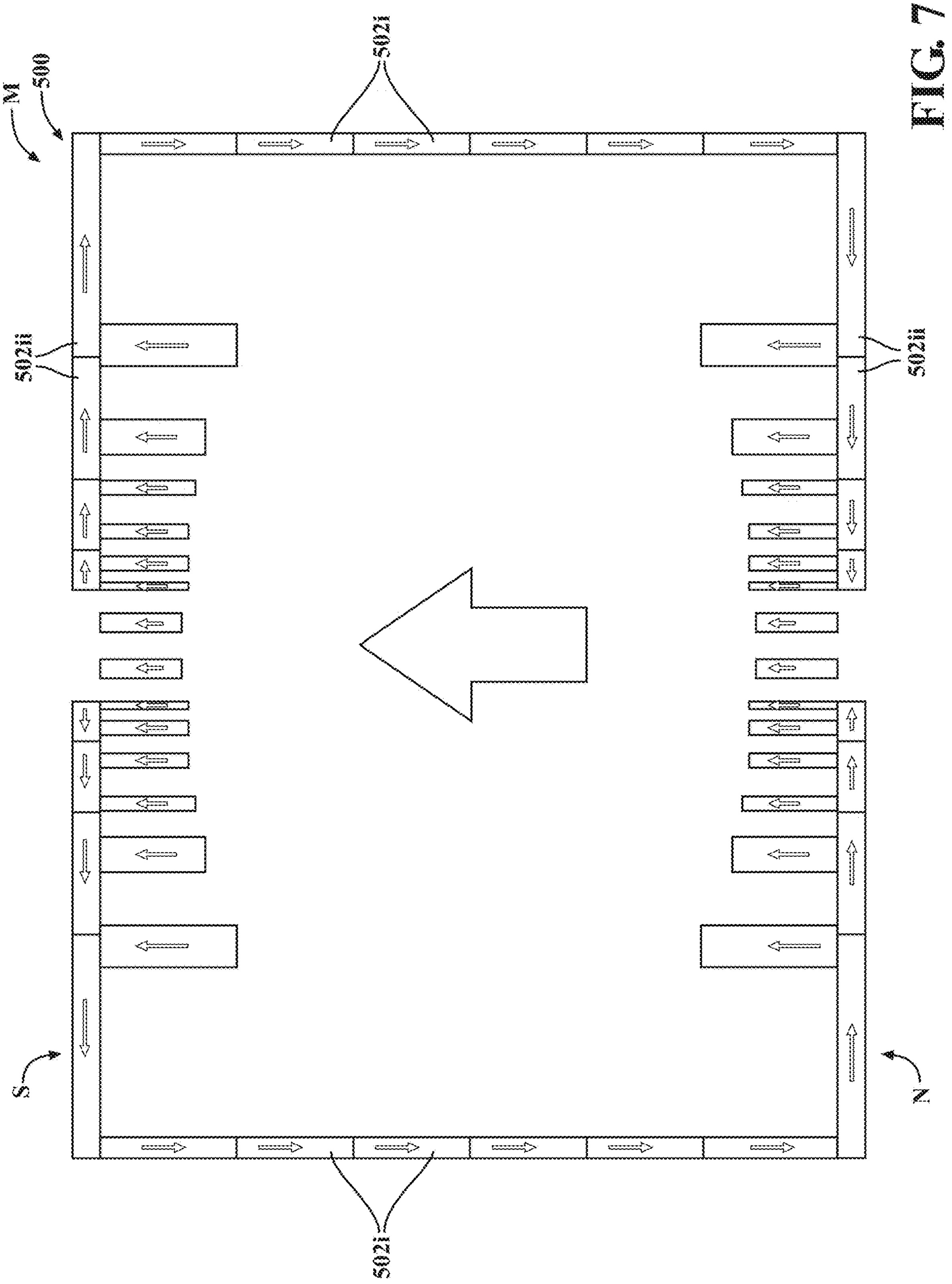
FIG. 7 is a schematic view illustrating a magnetic circuit established during operation of the MRI device and magnetic flux distribution.

The magnetic tiles 502 may include at least one of (first) magnetic tiles 502*i*, which are arranged in a first orientation, and (second) magnetic tiles 502*ii*, which are arranged in a second, different orientation. More specifically, as seen in FIG. 5, both the magnetic tiles 502*i* and 502*ii* are included, and the magnetic tiles 502*ii* are oriented in generally orthogonal (perpendicular) relation with the magnetic tiles 502*i*. The magnetic tiles 502*i* may be arranged in a generally axial (e.g., vertical) orientation, such that the magnetic tiles 502*i* extend in generally parallel relation to the longitudinal axis L of the MRI device 10, and the magnetic tiles 502*ii* may be arranged in a generally lateral (e.g., horizontal, radial) orientation. As a result, the magnetic tiles 502*i*, 502*ii* distribute (overflow) magnetic flux in generally axial (vertical) and generally horizontal (lateral, radial) directions, respectively, which, together with the (working) magnetic flux associated with the primary magnetic field generated by the magnet assembly 200, form the generally closed magnetic circuit M as shown in FIG. 7.

Figure 6:
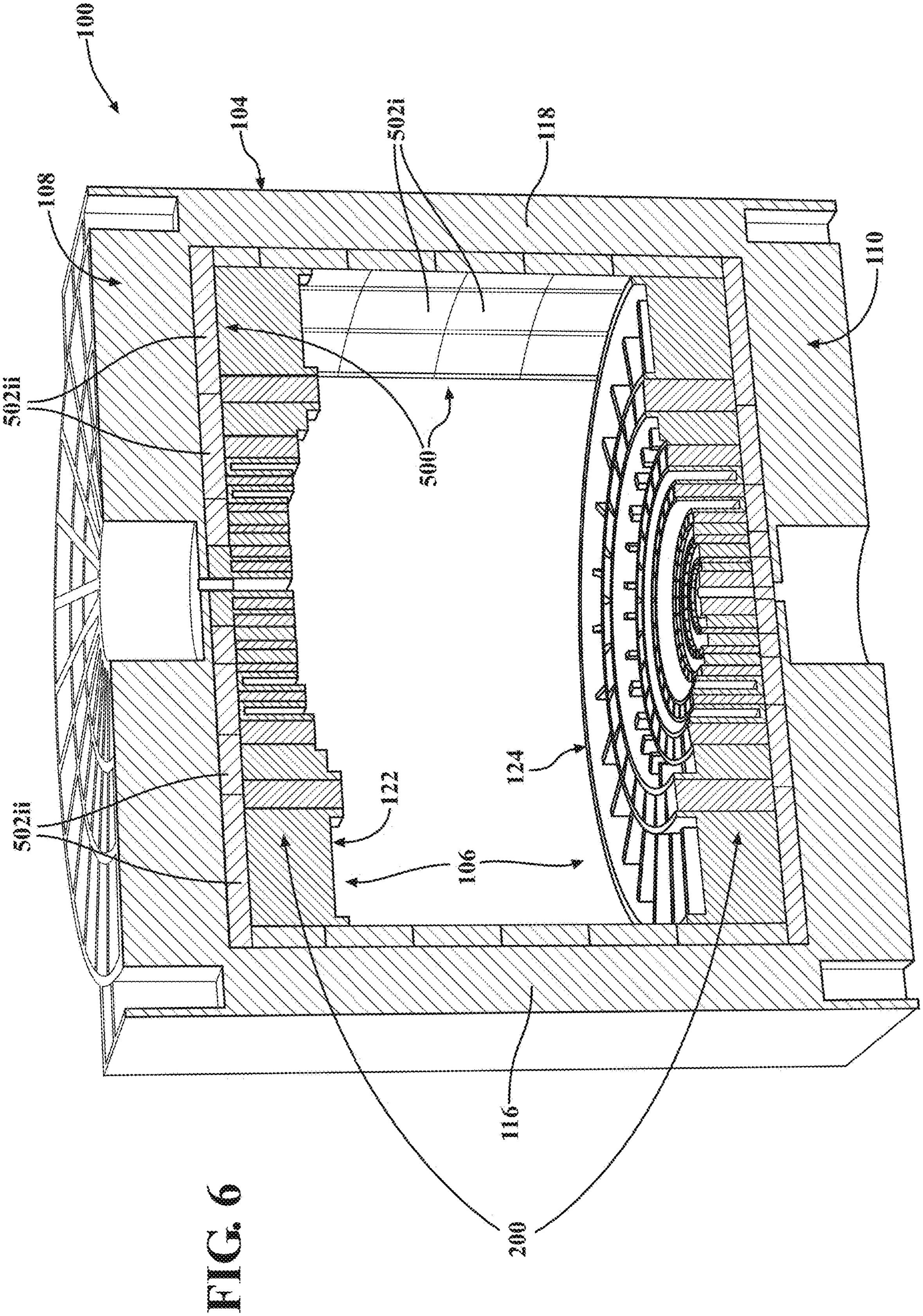
FIG. 6 is a partial, cross-sectional view of the MRI device illustrating the frame assembly, the magnet assembly, and the inner shield.

As shown in FIG. 6, the magnetic tiles 502*i* may be located, connected or secured to the inner surface of at least one of the backspans 116 and 118. In some implementations, as shown in FIG. 2, at least one of the backspans 116 and 118 may include a first body part (e.g., upper part) and second body part (e.g., lower part) detachably connected to each other, so as to facilitate the assemble, modification or disassembly of the magnetic tiles 502*i*.

The magnetic tiles 502*ii* may be located, secured or connected between the outer frame 104 and inner frame 106, e.g., between the support member 108 and the tray 122, and/or between the support member 110 and the tray 124. The magnetic tiles 502*ii* may be located spaced from each other with gaps same as or different from the spaces between the receptacles or magnetic blocks. The magnetic tiles 502*ii* and the magnetic tiles 502*i* may have thicknesses less than a threshold value and/or a cross-sectional dimension less than a threshold value, so as to facilitate the mobility of the MRI device and provide enough space for access to the shim magnets (e.g., at least one of the openings 126 extend through the spaces between the magnetic tiles 205*ii*) as well as to reduce eddy current.

Figure 8:
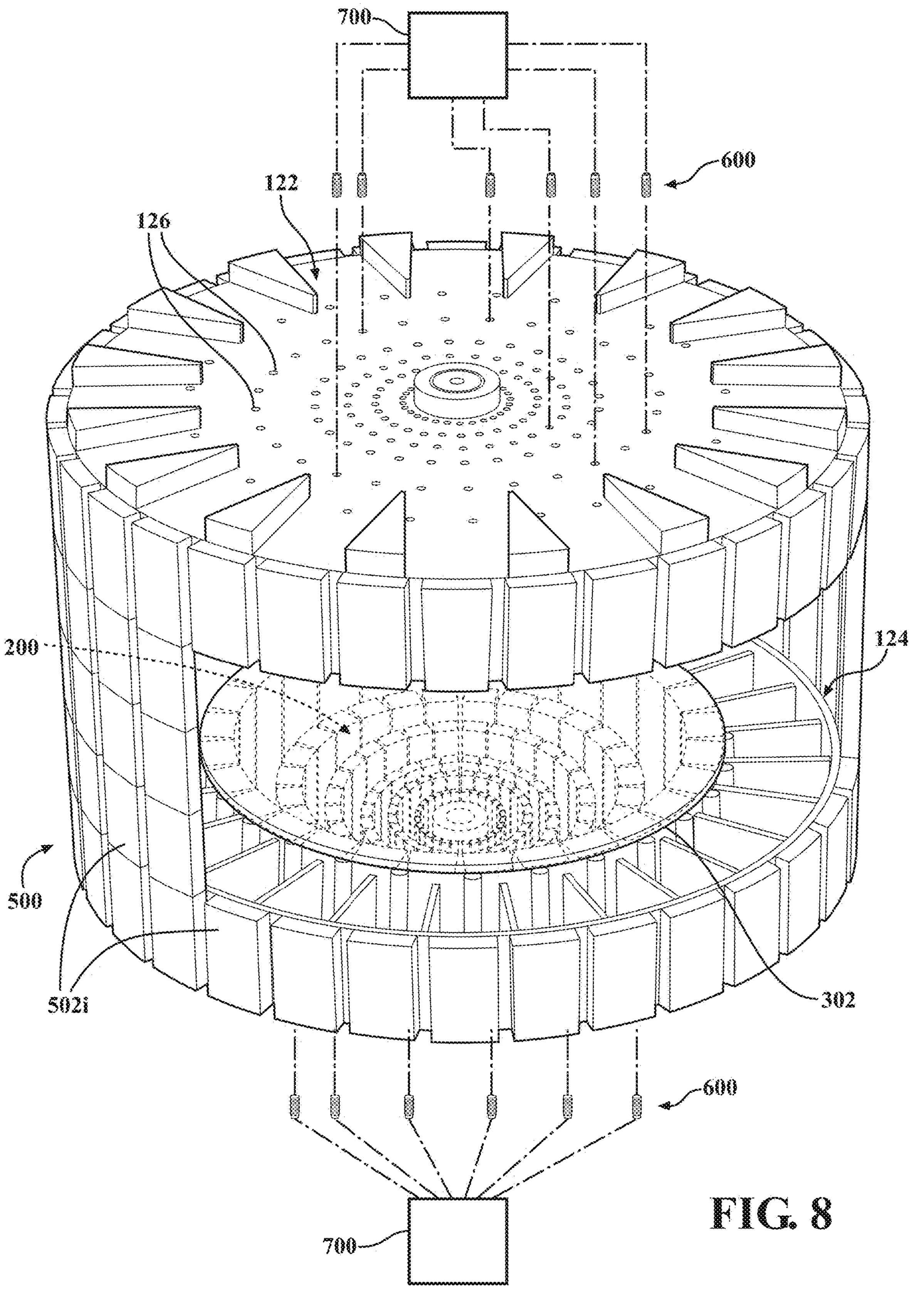
FIG. 8 is a partial, top, perspective view of MRI device illustrating the inner frame, the magnet assembly, the gradient panels, the inner shield, and the shim magnets.
Figure 9:
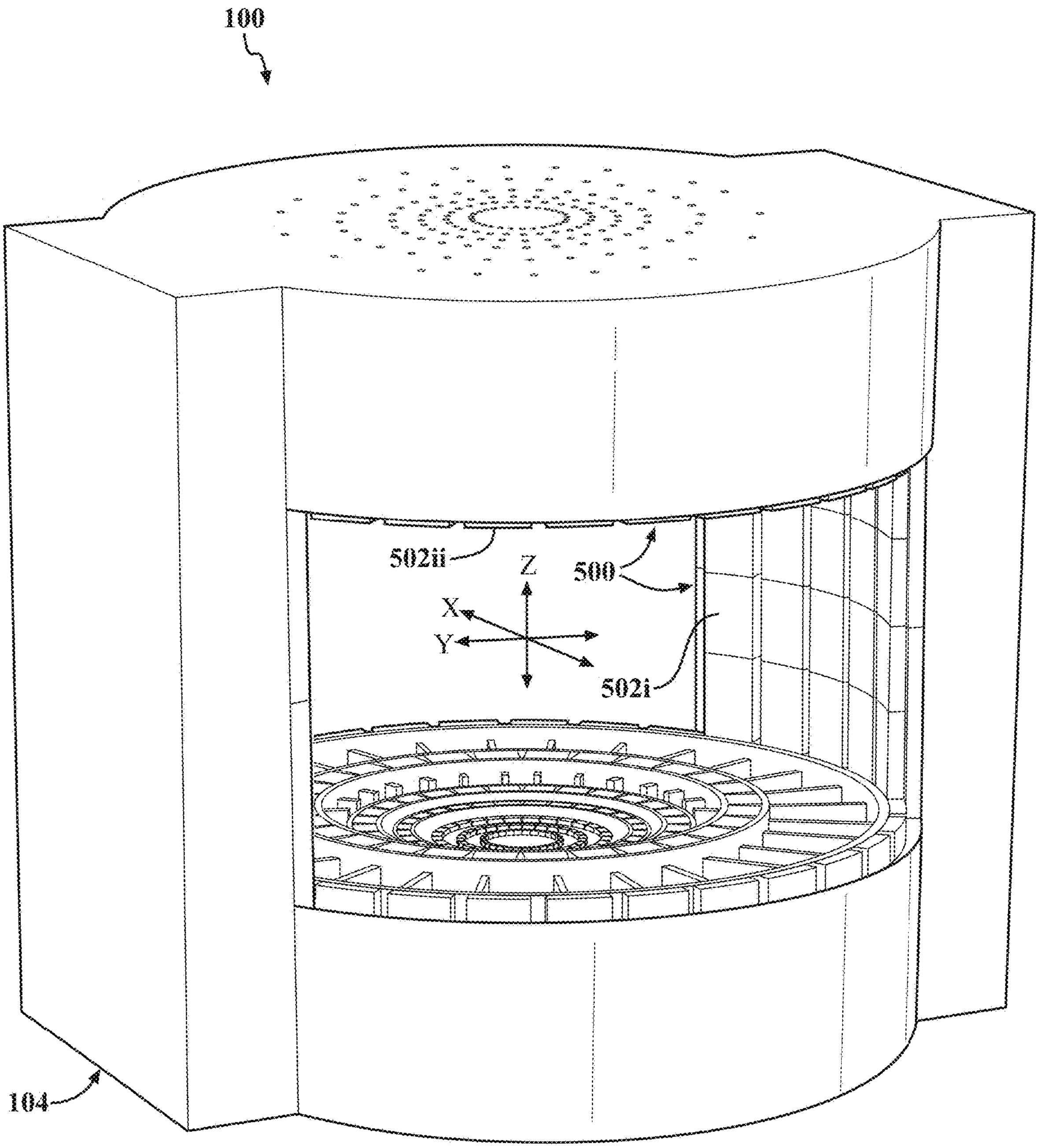
FIG. 9 is a partial, top, perspective view of MRI device illustrating the frame assembly and the inner shield.

The shim magnets 600 (FIGS. 8, 10) are adjustably supported by the frame assembly 100 (i.e., the inner frame 106 and/or the outer frame 104) such that the shim magnets 600 are independently repositionable in relation thereto in order to increase uniformity of the primary magnetic field generated by the magnet assembly 200, as described in further detail below. The shim magnets 600 are positioned within (received by) the openings 126 such that the shim magnets 600 are positioned laterally (e.g., radially) between at least a part of the magnetic blocks 206 or 208, and/or axially (e.g., vertically) between the magnetic tiles 502*ii* (FIG. 6) and the gradient panels 300, 302 (FIGS. 8, 10). In this case, at least one of the openings 126 may be located between the magnetic blocks 206 and/or 208. For example, at least one of the openings 126 is positioned in the partition members of the receptacles 128 and/or 130, or in the body part of the trays 122 and/or 124. In some alternate implementations, at least one of the openings 126 may be located within the receptacles 128 and/or 130 and may be stacked with and spaced from the magnetic blocks 206 and/or 208 along the axial (e.g., vertically) direction, which is not limited herein.

Referring to FIG. 8, the shim magnets 600 may include (first, upper) shim magnets 600*i*, which are positioned laterally (e.g., radially) between the magnetic blocks 206, and (second, lower) shim magnets 600*ii*, which are positioned laterally (e.g., radially) between the magnetic blocks 208. The axial positions of the shim magnets 600 may be adjustable. In some examples, the shim magnets 600*i* are located axially (e.g., vertically) between the magnetic tiles 502*ii* and the gradient panel 300, and the shim magnets 600*ii* are positioned axially (e.g., vertically) between the magnetic tiles 502*ii* and the gradient panel 302.

In the illustrated embodiment, the shim magnets 600 are configured for removable insertion into the openings 126. Embodiments in which the shim magnets 600 may be captive to (i.e., non-removable from) the MRI device 10 are also envisioned herein, however, and would not be beyond the scope of the present disclosure.

In some implementations, the shim magnets 600 threadably engage the inner frame 106 (i.e., the trays 122, 124) such that rotation of the shim magnets 600 causes corresponding axial (e.g., vertical) displacement thereof (i.e., along the longitudinal axis L of the MRI device 10). More specifically, the openings 126 and the shim magnets 600 include corresponding threaded surfaces 136, 602, respectively, which are configured for engagement (contact) to facilitate rotatable adjustment of the shim magnets 600 in relation to the inner frame 106 (i.e., the trays 122, 124) and, thus, incremental adjustments to the axial (e.g., vertical) positions thereof. In alternate implementations, the displacement of the shim magnets 600 may be along the radial or lateral direction of the MRI device 10, which is not limited herein.

In contrast to known MRI shimming methodologies, the shim magnets 600 described herein simplify assembly of the MRI device 10 and facilitate high-volume production thereof. More specifically, the threaded engagement between the shim magnets 600 and the inner frame 106 eliminates the need for an adhesive connection therebetween, thereby obviating the potential contamination issues associated with known MRI shimming methodologies and avoids any impact on the configuration and/or the positioning (location) of the gradient panels 300, 302. Additionally, when compared with known MRI shimming methodologies, the shimming methodology described herein allows shimming of the MRI device 10 to be developed using software simulation, which facilitates batch production, and facilitates installation (connection) of the gradient panels 300, 302 prior to installation (connection) of the shim magnets 600, which obviates any interference with installation (connection) of the gradient panels 300, 302 that might otherwise occur during shimming. Additionally, the shimming methodologies described herein allow for repeated adjustment of the shim magnets 600 by eliminating the adhesive connection that is commonly utilized during shimming and obviate the need to remove the gradient panels 300, 302 in order to permit such adjustment.

Figure 11:
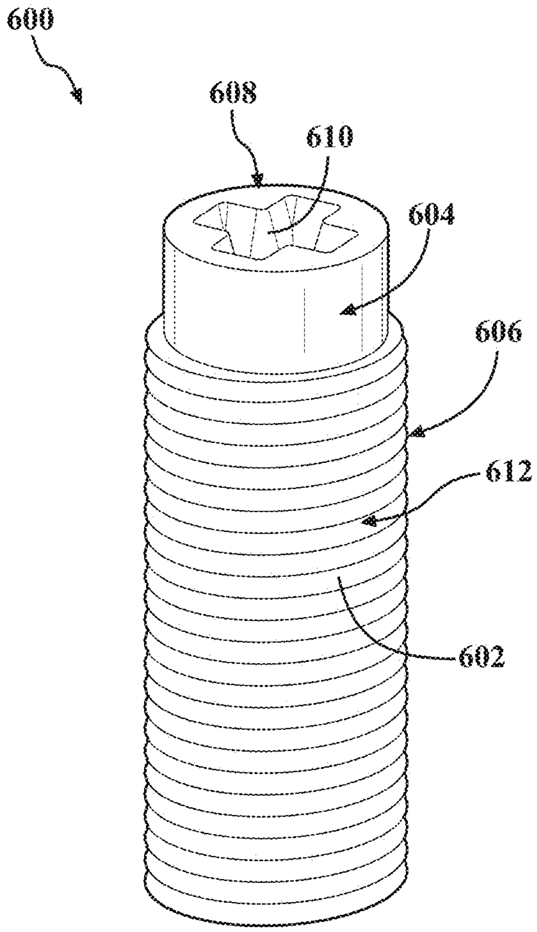
FIG. 11 is a top, perspective of one of the shim magnets.

As seen in FIG. 11, each of the shim magnets 600 is generally cylindrical in configuration and includes an (inner) core 604 and an (outer) bushing 606.

Each core 604 includes a magnetic material (e.g., steel) such that, upon magnetization, the shim magnets 600 generate an ancillary magnetic field that supplements the primary and secondary magnetic fields respectively generated by the magnet assembly 200 and the gradient panels 300, 302. Via rotation of the shim magnets 600 (i.e., in relation to the inner frame 106) and the resulting variations in the axial (vertical) positions thereof, the distribution of the ancillary magnetic field can be incrementally adjusted in order to increase the uniformity of the primary magnetic field. To further increase the uniformity of the primary magnetic field, it is envisioned that the specific positions (locations) and/or the particular number of the shim magnets 600 may be varied as required (e.g., based upon the measured uniformity thereof). For example, it is envisioned that the MRI device 10 may include shim magnets 600 between each of the magnetic blocks 206, 208 or, alternatively, that the MRI device 10 may only include shim magnets 600 between certain of the magnetic blocks 206 and/or the magnetic blocks 208.

The MRI device 10 is configured such that the directions of the primary magnetic field generated by the magnet assembly 200 and the ancillary magnetic field generated by the shim magnets 600 are parallel. In various embodiments, however, it is envisioned that the direction of the ancillary magnetic field may be either the same as that of the primary magnetic field or inverse in relation thereto.

In the illustrated embodiment, each shim magnet 600 (i.e., the core 604 thereof) includes an interface 608 (e.g., a groove 610) that is configured for engagement (contact) with a tool (not shown) in order to facilitate manual adjustment (manipulation) (i.e., rotation) of the shim magnets 600. Embodiments of the MRI device 10 including (one or more) at least one (electromechanical) actuator 700 (FIG. 8) that is connected (secured) to (e.g., engaged with) the shim magnets 600 and which is configured to automatically cause the rotation thereof (e.g., in response to a measured uniformity of the primary magnetic field) are also envisioned herein, however, and would not be beyond the scope of the present disclosure.

The bushing 606 receives (extends about) the core 604 and is connected (secured) thereto. It is envisioned that the core 604 and the bushing 606 may be connected (secured) together in any suitable manner (e.g., bonding, spinning edge sealing, plugging and covering, etc.).

The bushing 606 includes a non-magnetic material (e.g., brass), which facilitates more precise control over the strength of the ancillary magnetic field generated by the shim magnets 600, and includes an outer surface 612, which defines the aforementioned threaded surface 602.

With reference to FIGS. 1, 8, and 10, during shimming, the shim magnets 600 are inserted to the openings 126 such that the threaded surfaces 602 engage the threaded surfaces 136. The shim magnets 600 are then rotated (i.e., in relation to the frame assembly 100) in order to vary their axial (vertical) positions and, thus, spacing between the shim magnets 600 and the scanning area 102.

As discussed above, the axial (vertical) positional adjustment of the shim magnets 600 results in corresponding adjustments to the distribution of the ancillary magnetic field, which directly influences the uniformity of the primary magnetic field generated by the magnet assembly 200. Thus, by simply rotating the shim magnets 600, the shimming methodology described herein allows for greater uniformity in the primary magnetic field and facilitates high-volume production without any impact on the mounting and/or placement of the gradient panels 300, 302.

Persons skilled in the art will understand that the various embodiments of the disclosure described herein and shown in the accompanying figures constitute non-limiting examples, and that additional components and features may be added to any of the embodiments discussed herein above without departing from the scope of the present disclosure. Additionally, persons skilled in the art will understand that the elements and features shown or described in connection with one embodiment may be combined with those of another embodiment without departing from the scope of the present disclosure and will appreciate further features and advantages of the presently disclosed subject matter based on the description provided. Variations, combinations, and/or modifications to any of the embodiments and/or features of the embodiments described herein that are within the abilities of a person having ordinary skill in the art are also within the scope of the disclosure, as are alternative embodiments that may result from combining, integrating, and/or omitting features from any of the disclosed embodiments.

Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow and includes all equivalents of the subject matter of the claims.

In the preceding description, reference may be made to the spatial relationship between the various structures illustrated in the accompanying drawings, and to the spatial orientation of the structures. However, as will be recognized by those skilled in the art after a complete reading of this disclosure, the structures described herein may be positioned and oriented in any manner suitable for their intended purpose. Thus, the use of terms such as "above," "below," "upper," "lower," "inner," "outer," "left," "right," "upward," "downward," "inward," "outward," etc., should be understood to describe a relative relationship between the structures and/or a spatial orientation of the structures. Those skilled in the art will also recognize that the use of such terms may be provided in the context of the illustrations provided by the corresponding figure(s).

Additionally, terms such as "approximately," "generally," "substantially," and the like should be understood to allow for variations in any numerical range or concept with which they are associated and encompass variations on the order of 25% (e.g., to allow for manufacturing tolerances and/or deviations in design). For example, the term "generally parallel" should be understood as referring to configurations in with the pertinent components are oriented so as to define an angle therebetween that is equal to 180°±25% (i.e., an angle that lies within the range of (approximately) 135° to (approximately) 225°) and the term "generally orthogonal" should be understood as referring to configurations in with the pertinent components are oriented so as to define an angle therebetween that is equal to 90°±25% (i.e., an angle that lies within the range of (approximately) 67.5° to (approximately) 112.5°). The term "generally parallel" should thus be understood as referring to encompass configurations in which the pertinent components are arranged in parallel relation, and the term "generally orthogonal" should thus be understood as referring to encompass configurations in which the pertinent components are arranged in orthogonal relation.

Although terms such as "first," "second," "third," etc., may be used herein to describe various operations, elements, components, regions, and/or sections, these operations, elements, components, regions, and/or sections should not be limited by the use of these terms in that these terms are used to distinguish one operation, element, component, region, or section from another. Thus, unless expressly stated otherwise, a first operation, element, component, region, or section could be termed a second operation, element, component, region, or section without departing from the scope of the present disclosure.

Each and every claim is incorporated as further disclosure into the specification and represents embodiments of the present disclosure. Also, the phrases "at least one of A, B, and C" and "A and/or B and/or C" should each be interpreted to include only A, only B, only C, or any combination of A, B, and C.

What is claimed is:

1. A magnetic resonance imaging (MRI) device comprising:

a frame assembly;

a magnet assembly supported by the frame assembly and configured to generate a primary magnetic field, wherein the magnet assembly includes a plurality of magnetic blocks; and shim magnets configured to generate an ancillary magnetic field supplementing the primary magnetic field, wherein the shim magnets are adjustably supported by the frame assembly such that the shim magnets are repositionable in relation thereto in order to increase uniformity of the primary magnetic field, wherein the frame assembly defines openings, and the shim magnets are received within the openings such that the shim magnets are positioned laterally between the plurality of magnetic blocks.

2. The MRI device of claim 1, wherein the plurality of magnetic blocks are arranged in concentric rings along a single plane such that the single plane extends through each of the plurality of magnetic blocks.

3. The MRI device of claim 1, wherein the shim magnets are rotatably adjustable.

4. The MRI device of claim 3, wherein the shim magnets threadably engage the frame assembly such that rotation of the shim magnets causes axial displacement thereof.

5. The MRI device of claim 1, further comprising:

actuators connected to the shim magnets to facilitate repositioning thereof.

6. The MRI device of claim 1, wherein the plurality of magnetic blocks are stacked along a longitudinal axis of the MRI device.

7. A magnetic resonance imaging (MRI) device comprising:

a frame assembly defining a scanning area, wherein the frame assembly includes:

an outer frame; and an inner frame supported by the outer frame;

a magnet assembly supported by the inner frame and configured to generate a magnetic field;

an inner shield supported by the outer frame and the inner frame, wherein the inner shield collects and distributes magnetic flux from the magnet assembly about the scanning area to thereby reduce magnetic flux leakage; and an outer shield extending about the outer frame, wherein the outer shield further reduces magnetic flux leakage and inhibits external electromagnetic interference with the MRI device.

8. The MRI device of claim 7, wherein the inner shield includes magnetic tiles configured as discrete components thereof.

9. The MRI device of claim 8, wherein the magnetic tiles are spaced from each other so as to reduce eddy current.

10. The MRI device of claim 8, wherein the magnetic tiles include:

first magnetic tiles arranged in a first orientation; and second magnetic tiles arranged in a second orientation different from the first orientation.

11. The MRI device of claim 10, wherein the first magnetic tiles and the second magnetic tiles are oriented in generally orthogonal relation.

12. A magnetic resonance imaging (MRI) device comprising:

a frame assembly defining a scanning area, wherein the frame assembly includes:

an outer frame; and an inner frame supported by the outer frame, wherein the inner frame includes:

an upper tray; and a lower tray spaced from the upper tray along a longitudinal axis of the MRI device;

an upper magnet assembly positioned within the upper tray;

a lower magnet assembly positioned within the lower tray, wherein the upper magnet assembly and the lower magnet assembly collectively generate a primary magnetic field;

an inner shield supported by the outer frame and the inner frame, wherein the inner shield collects and distributes magnetic flux from the upper magnet assembly and the lower magnet assembly about the scanning area to thereby reduce magnetic flux leakage and contain the primary magnetic field withing a generally closed magnetic circuit in order to reduce a 5 Gauss line of the MRI device;

an outer shield extending about the outer frame, wherein the outer shield further reduces magnetic flux leakage and inhibits external electromagnetic interference with the MRI device; and shim magnets configured to generate an ancillary magnetic field supplementing the primary magnetic field, wherein the shim magnets are adjustably supported by the inner frame such that the shim magnets are repositionable in relation thereto in order to increase uniformity of the primary magnetic field, wherein the shim magnets include:

upper shim magnets positioned between magnetic blocks of the upper magnet assembly; and lower shim magnets positioned between magnetic blocks of the lower magnet assembly.

13. The MRI device of claim 12, wherein the inner shield includes magnetic tiles configured as discrete components thereof.

14. The MRI device of claim 13, wherein the magnetic tiles includes:

first magnetic tiles arranged in a first orientation; and second magnetic tiles arranged in a second orientation different from the first orientation.

15. The MRI device of claim 14, wherein the first magnetic tiles and the second magnetic tiles are oriented in generally orthogonal relation.

16. The MRI device of claim 15, wherein the first magnetic tiles are arranged in a generally axial orientation such that the first magnetic tiles extend in generally parallel relation to the longitudinal axis of the MRI device, and the second magnetic tiles are arranged in a generally lateral orientation.

17. The MRI device of claim 13, wherein the magnetic tiles are spaced from each other so as to reduce eddy current.

18. The MRI device of claim 12, wherein the shim magnets are rotatably adjustable.

19. The MRI device of claim 12, wherein the shim magnets each include:

a core including a magnetic material; and a bushing receiving the core, wherein the bushing includes a non-magnetic material.

20. The MRI device of claim 19, wherein the core includes an interface configured for engagement with a tool to facilitate manual adjustment of shim magnets.

21. The MRI device of claim 18, wherein the shim magnets and the inner frame include corresponding threaded surfaces, whereby the shim magnets threadably engage the inner frame such that rotation of the shim magnets causes axial displacement thereof.

* * * * *